(12) United States Patent
Suzuki et al.

(10) Patent No.: US 8,385,857 B2
(45) Date of Patent: Feb. 26, 2013

(54) WIRELESS COMMUNICATION APPARATUS

(75) Inventors: Kenji Suzuki, Kawasaki (JP);
Toshikazu Tsuchiya, Kawasaki (JP);
Michiko Satou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 160 days.

(21) Appl. No.: 12/780,256

(22) Filed: May 14, 2010

(65) Prior Publication Data

US 2010/0304694 A1 Dec. 2, 2010

(30) Foreign Application Priority Data

May 26, 2009 (JP) ................................ 2009-126272

(51) Int. Cl.
*H04B 1/04* (2006.01)
(52) U.S. Cl. ..................................... 455/127.1; 455/126
(58) Field of Classification Search .................. 455/126, 455/127.1–127.5, 114.3, 114.2
See application file for complete search history.

(56) References Cited

U.S. PATENT DOCUMENTS

| | | |
|---|---|---|
| 2004/0017257 A1 | 1/2004 | Kim |
| 2004/0032296 A1 | 2/2004 | Akaiwa |
| 2005/0057303 A1 | 3/2005 | Leffel |
| 2005/0190857 A1 | 9/2005 | Braithwaite |
| 2006/0135095 A1* | 6/2006 | Goldberg et al. .......... 455/127.1 |
| 2007/0129025 A1* | 6/2007 | Vasa et al. .................. 455/114.2 |
| 2007/0249302 A1* | 10/2007 | Sorrells et al. ............. 455/127.1 |
| 2008/0139140 A1* | 6/2008 | Matero et al. .............. 455/114.3 |

FOREIGN PATENT DOCUMENTS

| | | |
|---|---|---|
| JP | 2002-094335 | 3/2002 |
| JP | 2002-223171 | 8/2002 |
| JP | 2006-270797 | 10/2006 |

OTHER PUBLICATIONS

Extended European Search Report dated Sep. 22, 2010, from the corresponding European Application.
European Search Report dated Sep. 22, 2010, from the corresponding European Application.
Notification of Reasons for Refusal dated Oct. 30, 2012 from corresponding Japanese Application No. 2009-126272 with Partial Translation.

* cited by examiner

*Primary Examiner* — Lana N Le
(74) *Attorney, Agent, or Firm* — Katten Muchin Rosenman LLP

(57) ABSTRACT

A wireless communication apparatus configured to amplify a transmission signal at an amplifier and transmit the amplified transmission signal, the wireless communication apparatus includes a memory configured to store a distortion compensation coefficient for compensating a distortion characteristic of the amplifier, and an electrical-power measuring unit configured to measure electrical power of the transmission signal. The wireless communication apparatus includes a gain control unit configured to calculate a gain adjustment value for correcting the distortion compensation coefficient stored in the memory based on a power value measured by the electrical-power measuring unit, and a distortion-compensation processing unit configured to perform distortion compensation on the transmission signal based on the distortion compensation coefficient stored in the memory and the gain adjustment value.

5 Claims, 17 Drawing Sheets

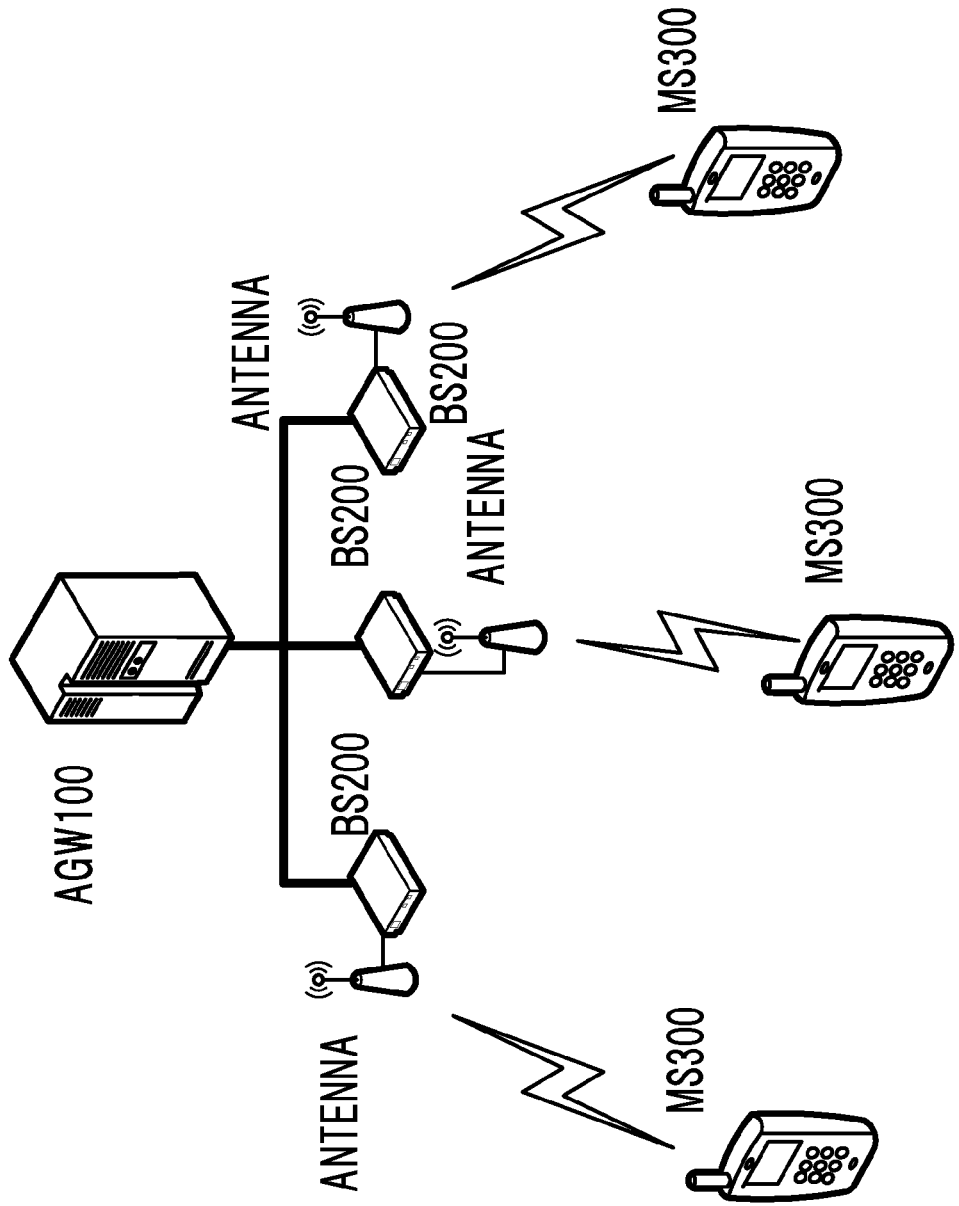

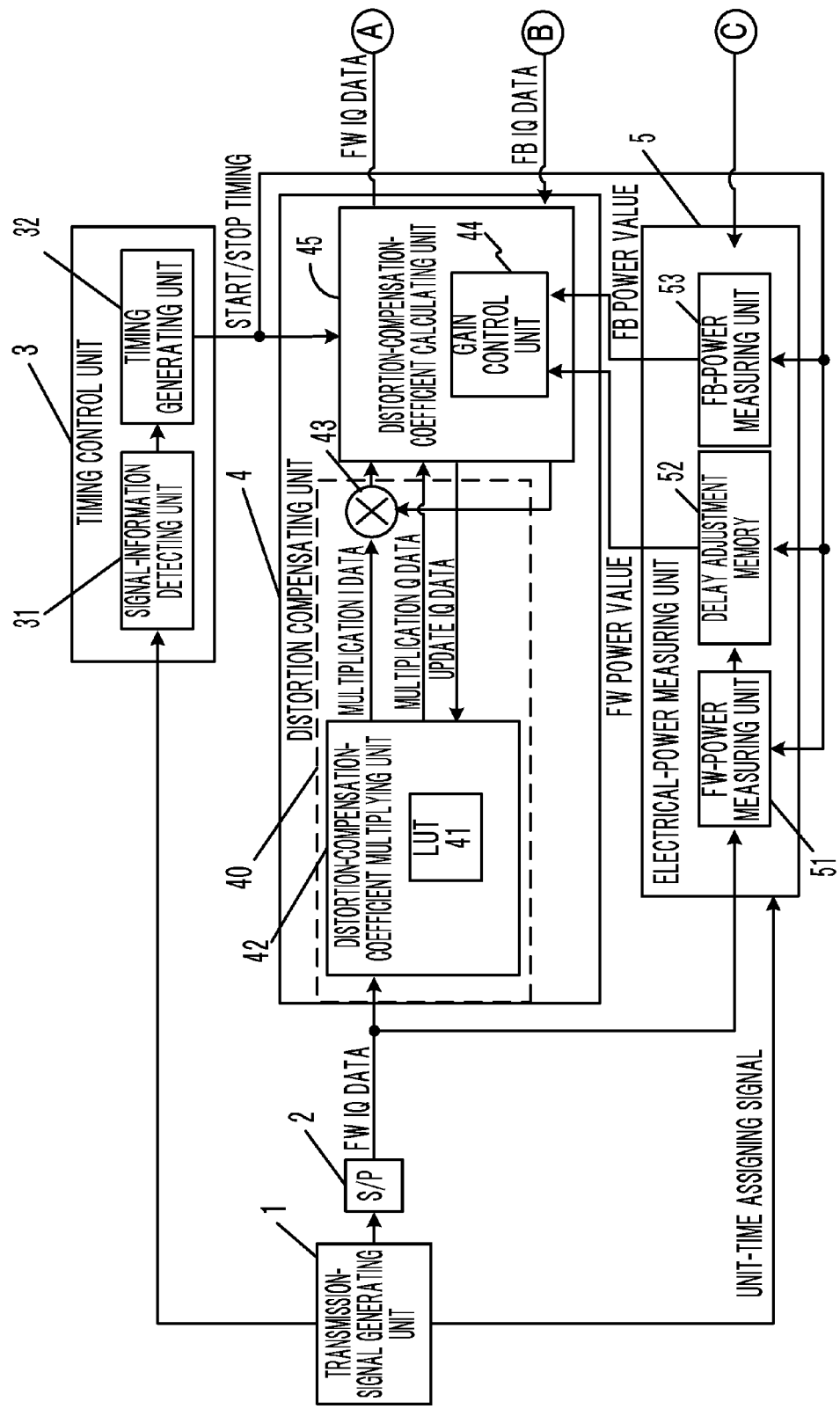

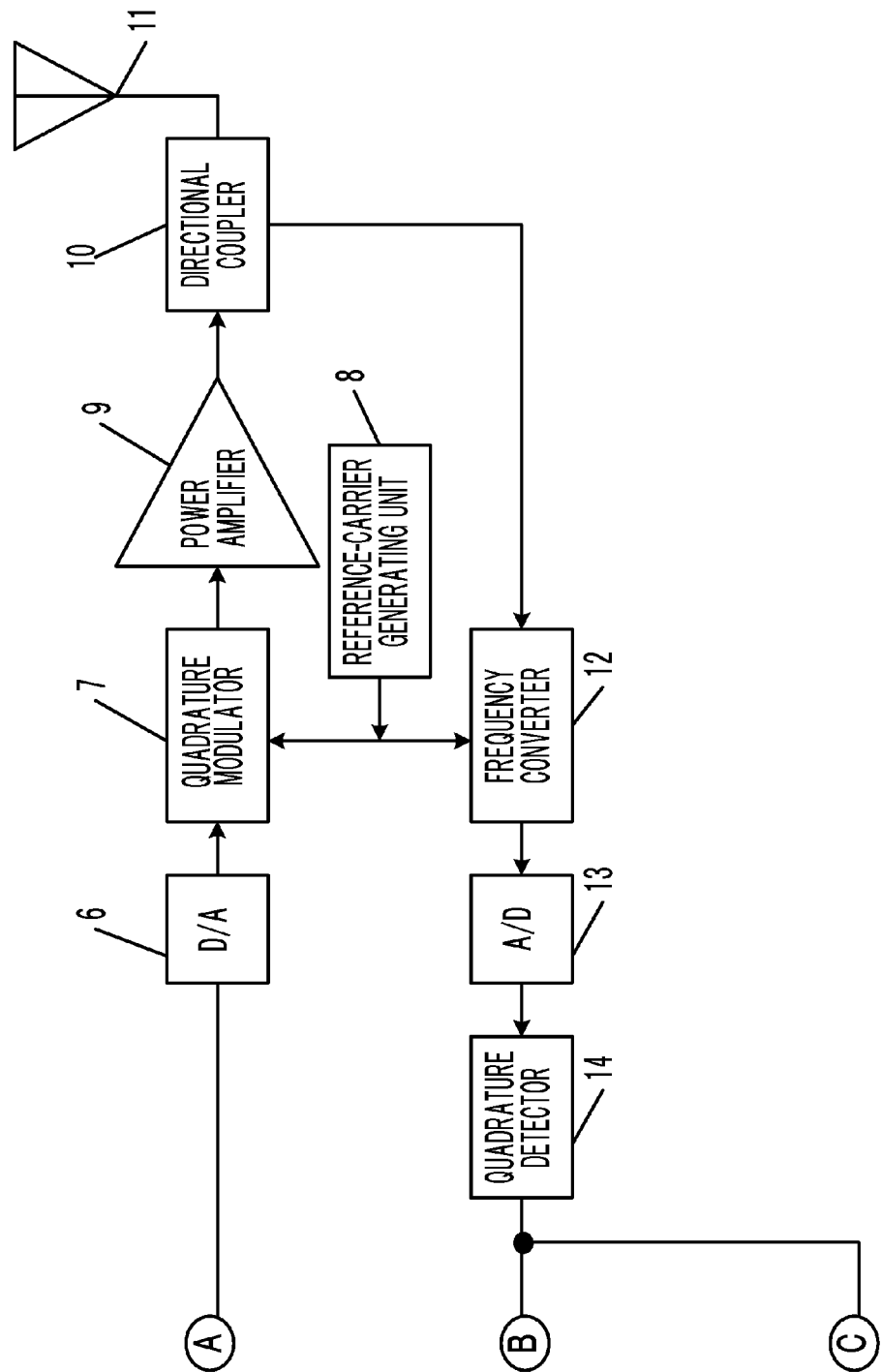

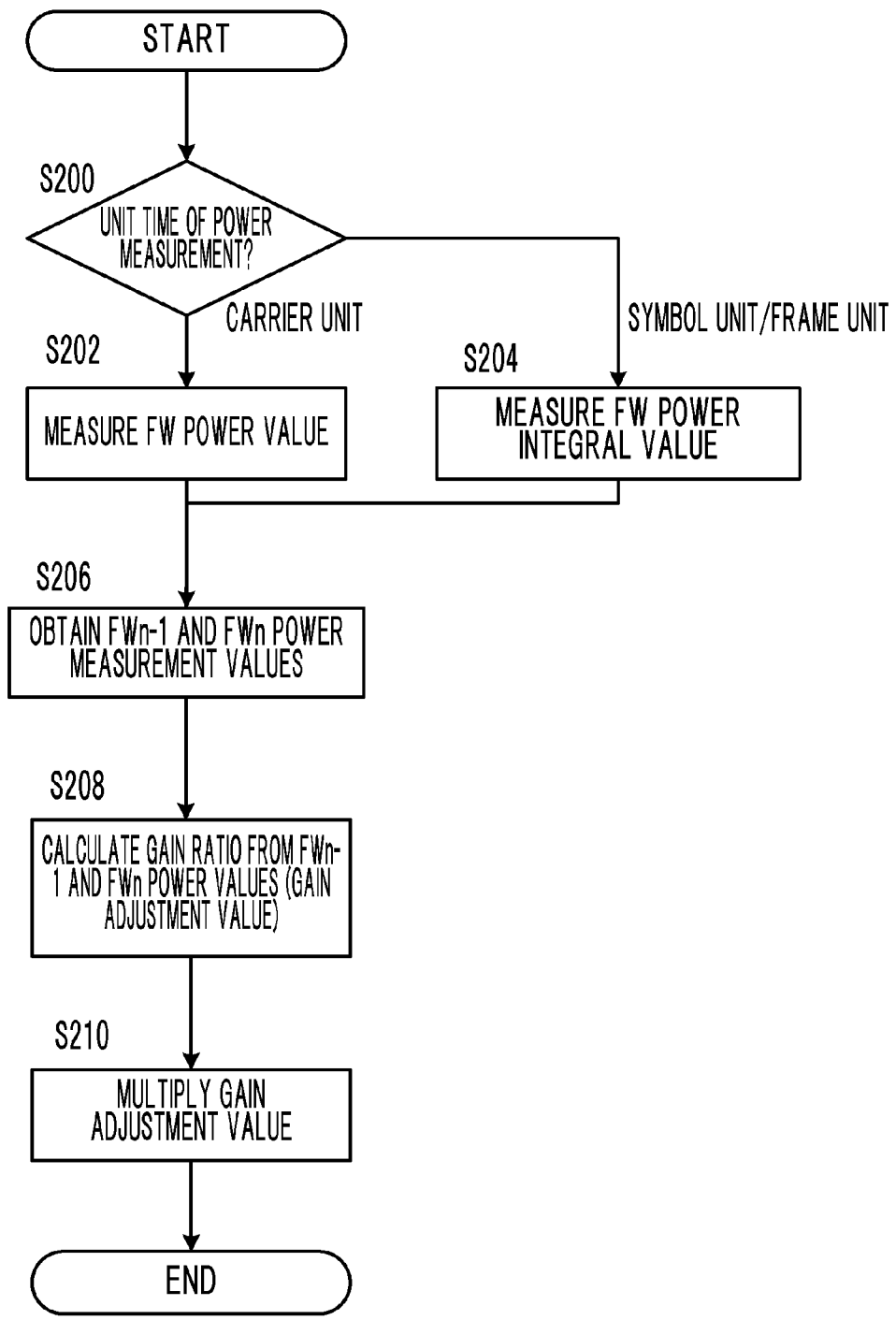

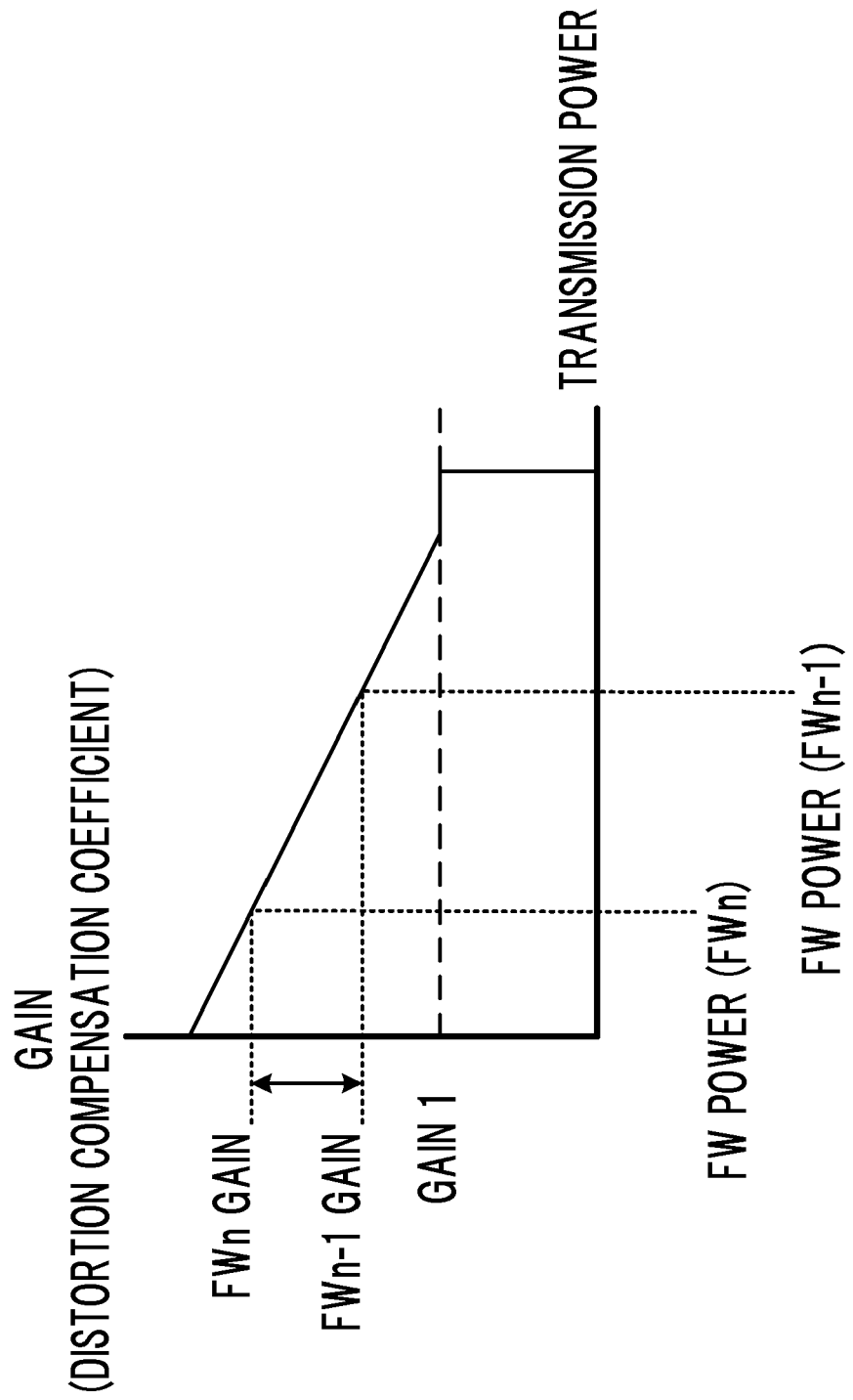

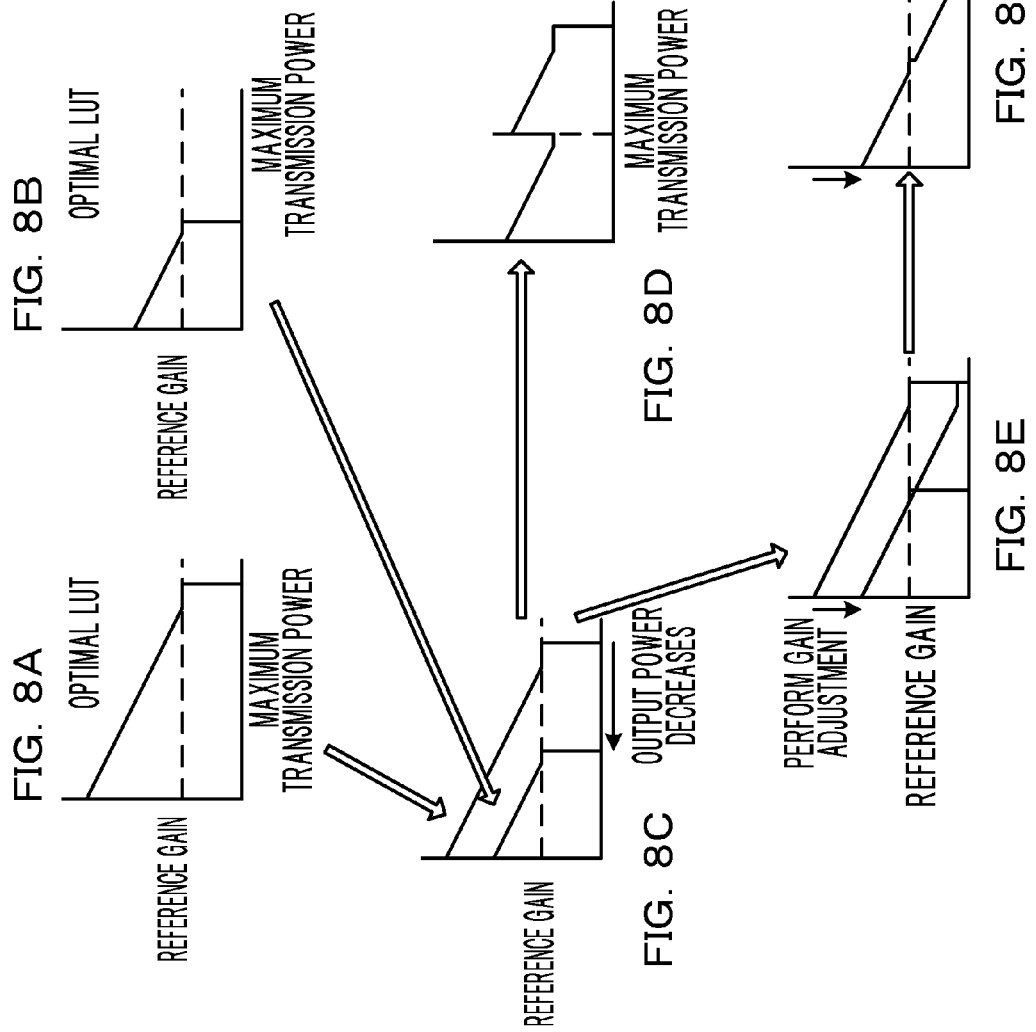

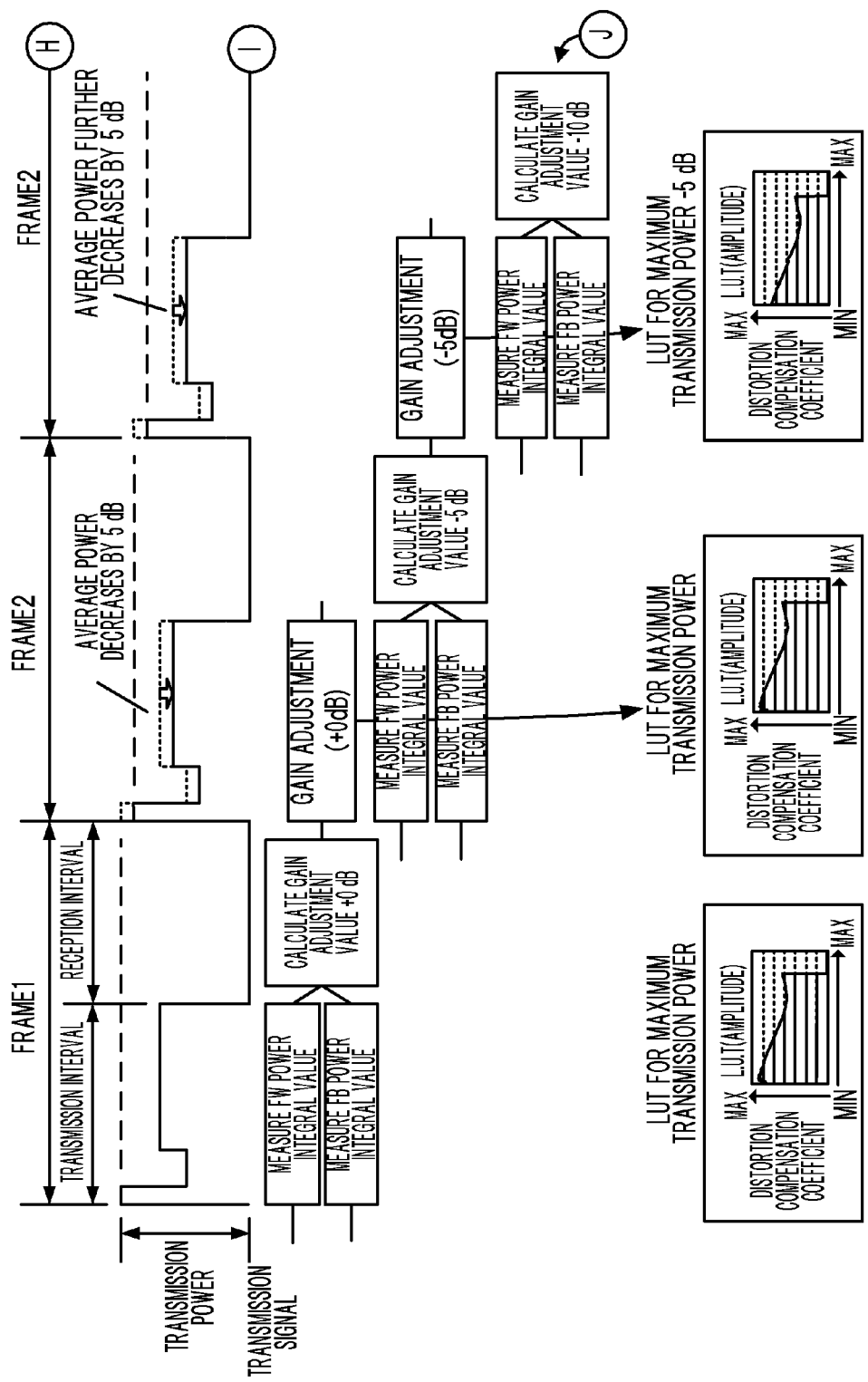

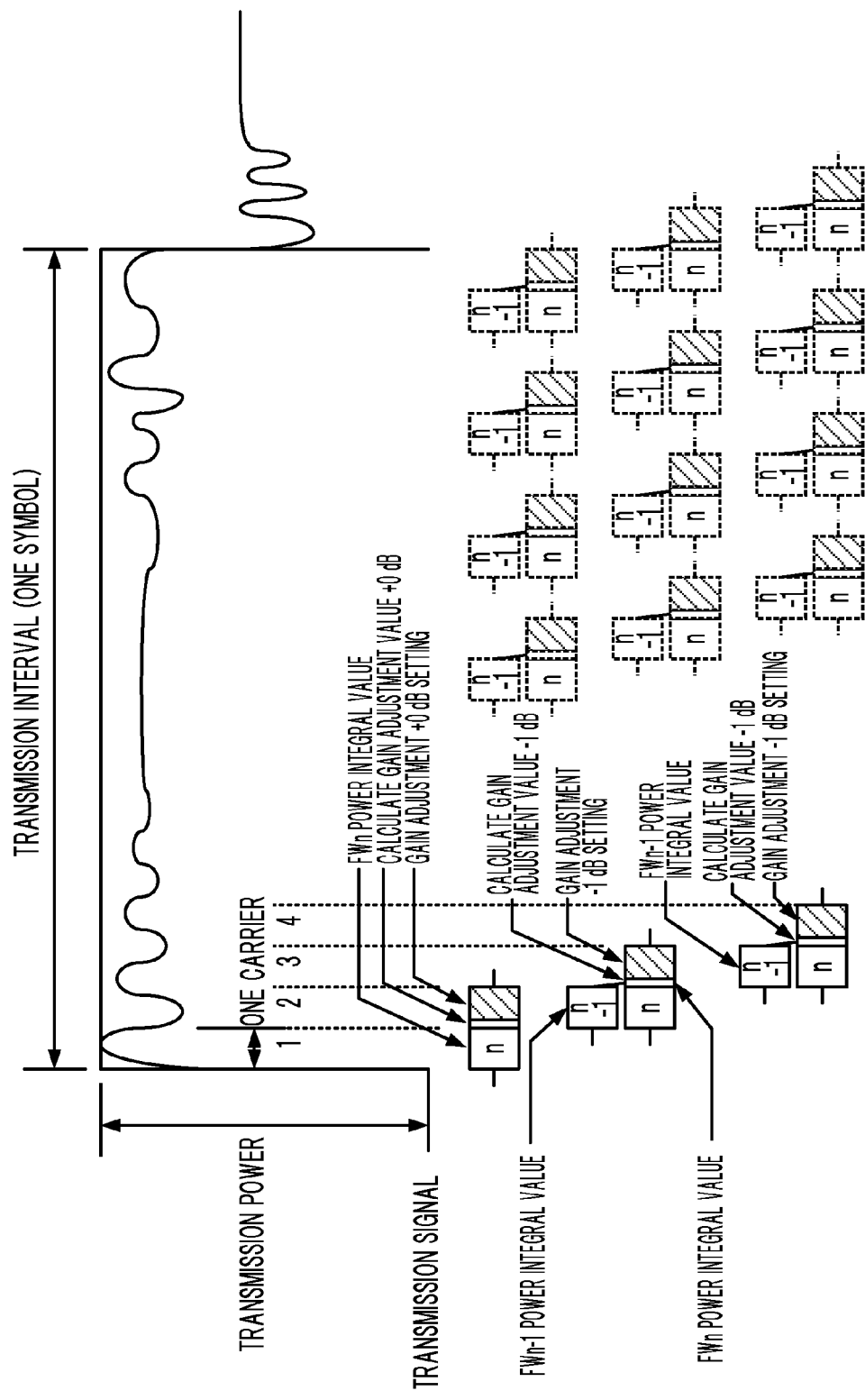

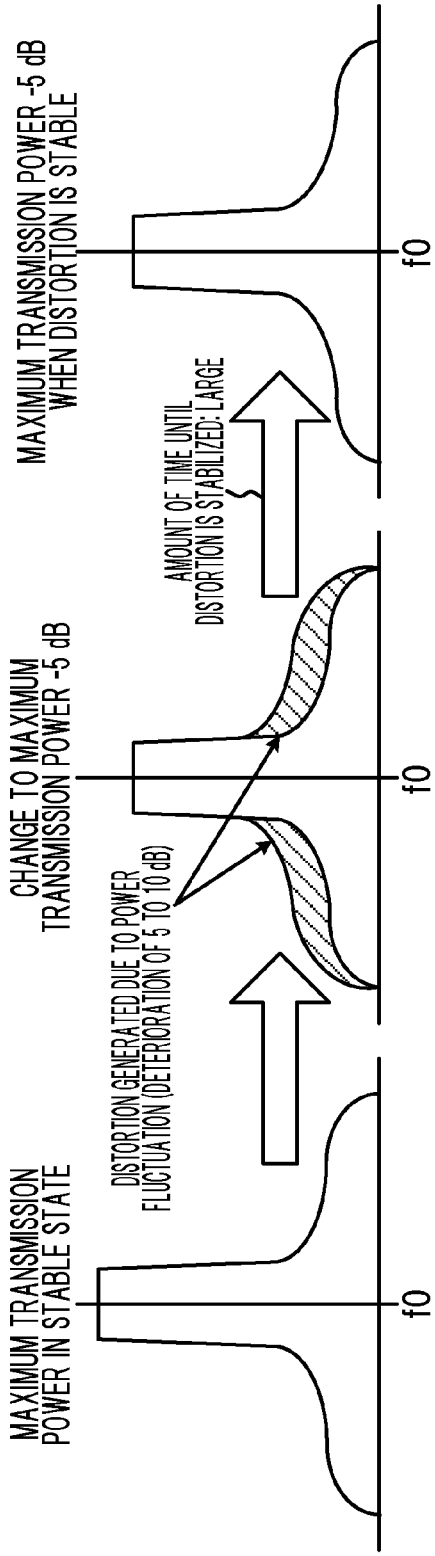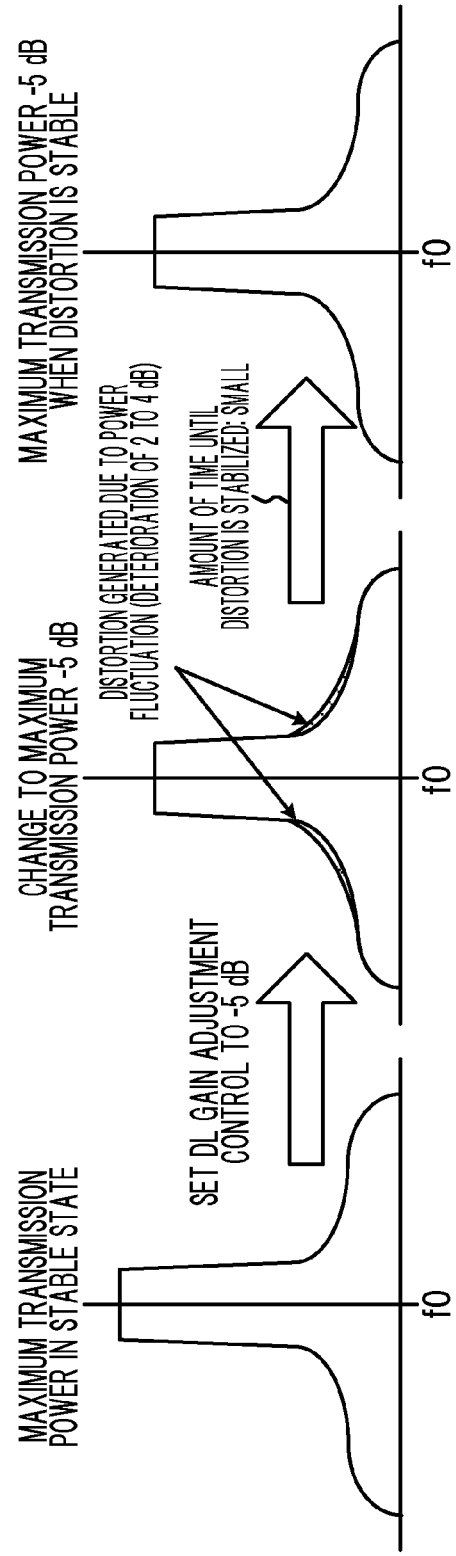

WIRELESS COMMUNICATION APPARATUS

CROSS-REFERENCE TO RELATED APPLICATIONS

This application is based upon and claims the benefit of priority of the prior Japanese Patent Application No. 2009-126272, filed on May 26, 2009, the entire contents of which are incorporated herein by reference.

FIELD

The present invention relates to a wireless communication apparatus that carries out distortion compensation on the distortion characteristic of an amplifier that amplifies transmission signals.

BACKGROUND

Power amplifiers that amplify modulated signals and low-noise amplifiers used for receivers of modulated signals are desired to have high-level linearity for suppressing deterioration in transmission characteristics caused by spectrum characteristics and/or signal distortion.

When multivalued amplitude modulation is used in wireless communication, it is desirable to suppress non-linear distortion by linearizing the amplitude characteristic of the power amplifier and to apply techniques for reducing adjacent channel power leakage. In general, amplifiers are desired to maintain constantly high power efficiency, but the efficiency and the linearity of an amplifier are usually contradicting characteristics. To improve power efficiency of an amplifier having low linearity, it is desirable to apply a technique that compensates the distortion caused by the amplifier.

One known distortion compensation method is the pre-distortion method. With the pre-distortion method, a desired signal without any distortion is obtained at the output of an amplifier by adding a characteristic opposite to the distortion characteristic of the amplifier to the signal input to the amplifier.

With distortion compensation according to the pre-distortion method, a transmission signal before distortion compensation and a demodulated feedback signal are compared to calculate and update a distortion compensation coefficient using the difference (power difference) determined by the comparison. The distortion compensation coefficient is stored in a memory with an address of amplitude, electrical power, or a function of amplitude and/or electrical power. By multiplying an updated distortion compensation coefficient with the transmission signal to be transmitted next, the gain of the transmission signal is adjusted to have an inverse characteristic of the distortion characteristic of the power amplifier. The gain-adjusted transmission signal is input to the power amplifier. By repeating the process, the distortion compensation coefficient converges to a final and optimal distortion compensation coefficient, and the distortion of the power amplifier is compensated.

To reduce the number of times calculation of the distortion compensation coefficient is carried out, there is a known technique of adjusting the gain of a transmission signal according to a distortion power obtained from a feedback signal. (For example, refer to Japanese Laid-Open Patent Publication No. 2006-270797.)

Recently, as a wireless communication technology, a technology known as Worldwide Interoperability for Microwave Access (WiMAX) has been attracting attention. WiMAX is a technology developed as a method of constructing a wireless metropolitan area network (MAN), which is a wide area network mutually connecting local area networks (LANs) in metropolitan areas and other specific areas, by wirelessly connecting telecommunications carriers and users' homes in replacement of telephone lines and optical fiber lines. WiMAX may cover an area of a diameter of approximately 50 km with a maximum transmission rate of approximately 70 Mbps with one wireless base station apparatus.

Currently, the Institute of Electrical and Electronic Engineers (IEEE) provides a WiMAX communication standard IEEE Std 802.16-2004 for fixed terminals and a mobile WiMAX communication standard IEEE Std 802.16e-2005.

With WiMAX, the transmission power changes in real time by an increase or a decrease in the number of users, and the transmission power level in each symbol interval fluctuates due to an increase or a decrease in the number of sub-carriers per symbol unit of the transmission signal. Thus, a change frequently occurs in the transmission power, causing the transmission power level to change after a distortion compensation coefficient is calculated at a certain transmission power. As a result, it is difficult to constantly obtain an optimal distortion compensation coefficient. Non-linear distortion due to the transmission power fluctuation occurs even when the rate of convergence by updating the distortion compensation coefficient is increased. Deterioration in the transmission quality due to adjacent channel power leakage is unavoidable until the distortion compensation coefficient converges again.

SUMMARY

According to an aspect of the invention, a wireless communication apparatus configured to amplify a transmission signal at an amplifier and transmit the amplified transmission signal, the wireless communication apparatus includes a memory configured to store a distortion compensation coefficient for compensating a distortion characteristic of the amplifier, and an electrical-power measuring unit configured to measure electrical power of the transmission signal. The wireless communication apparatus includes a gain control unit configured to calculate a gain adjustment value for correcting the distortion compensation coefficient stored in the memory based on a power value measured by the electrical-power measuring unit, and a distortion-compensation processing unit configured to perform distortion compensation on the transmission signal based on the distortion compensation coefficient stored in the memory and the gain adjustment value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1 illustrates an example configuration of a wireless communication system to which a wireless communication apparatus according to an embodiment is applied.

FIGS. 2A and 2B illustrate a first example configuration of a wireless communication apparatus according to an embodiment.

FIG. 5 illustrates a flow chart of gain adjustment for the second example configuration.

FIG. 6 illustrates a gain table.

FIGS. 8A-8G illustrate correction of a distortion compensation coefficient in response to a fluctuation in transmission power.

FIGS. 9A and 9B illustrate an example of gain adjustment in frame units.

FIG. 11 illustrates an example of gain adjustment in carrier units.

FIGS. 12A-12F illustrate changes in distortion in a transmission signal due to gain adjustment according to an embodiment.

DESCRIPTION OF EMBODIMENT

Figure 3:
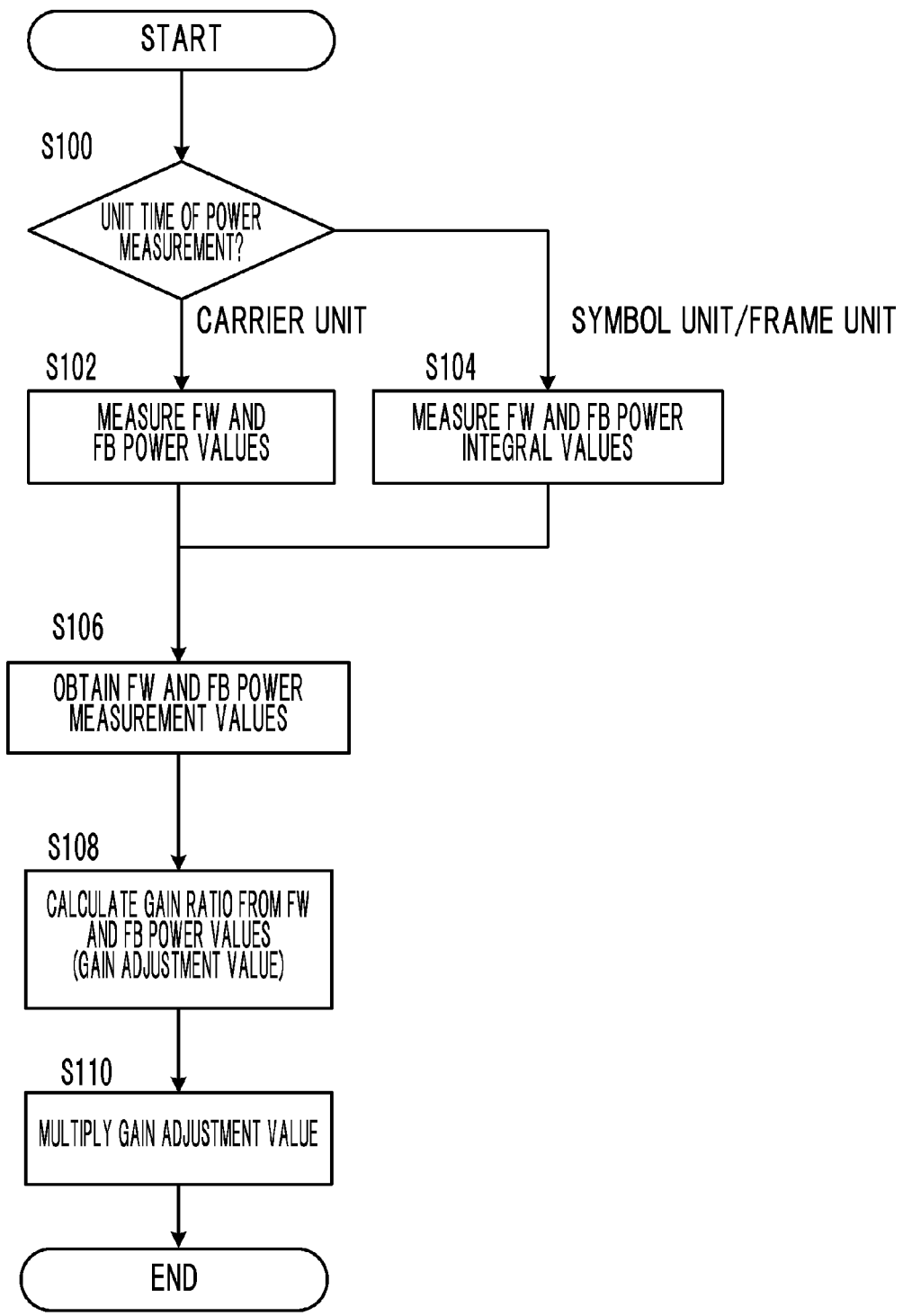
FIG. 3 illustrates a flow chart of gain adjustment for the first example configuration.

FIG. 1 illustrates an example configuration of a wireless communication system to which a wireless communication apparatus according to an embodiment is applied. For example, the wireless communication system is a mobile WiMAX system employing a time division duplex (TDD) method in which transmission intervals and reception intervals are alternated at the same frequency. The wireless communication system includes an access gateway (AGW) 100, a plurality of wireless base stations (BS) 200, which are wireless communication apparatuses, and mobile stations (MS) 300. Radio signals are transmitted and received between the wireless base stations 200 and the mobile stations 300. The access gateway 100 controls the wireless base stations 200. The wireless communication system may be a long term evolution (LTE) system. In a LTE system, the wireless base stations 200 are referred to as evolved nodes B (eNB), and the mobile stations 300 are referred to as user equipment (UE).

FIGS. 2A and 2B illustrate a first example configuration of the wireless communication apparatus according to the embodiment. The wireless communication apparatus includes a transmission-signal generating unit 1, a serial-to-parallel (S/P) converter 2, a timing control unit 3, a distortion compensating unit 4, an electrical-power measuring unit 5, a D/A converter 6, a quadrature modulator 7, a reference-carrier generating unit 8, a power amplifier 9, a directional coupler 10, an antenna 11, a frequency converter 12, an A/D converter 13, and a quadrature detector 14.

The transmission-signal generating unit 1 sends out serial digital data strings. The serial-to-parallel (S/P) converter 2 carries out serial-to-parallel conversion on the serial digital data strings and acquires parallel data strings of I signals and Q signals.

A signal-information detecting unit 31 of the timing control unit 3 detects map information (information indicating data positions) of a transmission signal. A timing generating unit 32 generates a distortion-compensation-coefficient-update-start timing signal and a distortion-compensation-coefficient-update-stop timing signal from the map information and a predetermined timing for switching between transmission intervals and reception intervals and outputs the generated timing signals to the distortion compensating unit 4. Hereinafter, the distortion-compensation-coefficient-update-start timing signal will be referred to as "update-start timing signal", and the distortion-compensation-coefficient-update-stop timing signal will be referred to as "update-stop timing signal". For example, the timing generating unit 32 outputs an update-start timing signal at the start timing of a transmission interval and outputs an update-stop timing signal at the end timing of the transmission interval. The timing generating unit 32 may output the update-start timing signal and the update-stop timing signal at intermediate timings in the transmission interval in accordance with the map information.

A distortion-compensation processing unit 40 of the distortion compensating unit 4 has a memory (look-up table (LUT)) 41 in which distortion compensation coefficients corresponding to the two-dimensional coordinates of the power level of a transmission signal and the power difference between the transmission signal and a feedback signal are stored. The distortion-compensation processing unit 40 includes a distortion-compensation-coefficient multiplying unit 42 that reads out a distortion compensation coefficient corresponding to the power level of a transmission signal from the LUT 41 and multiplies a parallel data string (transmission signal) of an I signal and a Q signal with the distortion compensation coefficient. The distortion-compensation processing unit 40 includes a gain adjusting unit 43 that adjusts the gain of the transmission signal multiplied by the distortion compensation coefficient.

The gain adjusting unit 43 multiplies the transmission signal with a gain adjustment value for correcting the distortion compensation coefficient read out from the LUT 41 and adjusts the gain of the transmission signal. As described below, gain adjustment is processing for correcting a distortion compensation coefficient in accordance with a power fluctuation in a transmission signal. Gain adjustment of a transmission signal is carried out by multiplying the I signal with the gain adjustment value. The gain adjustment value is determined by a gain control unit 44 based on a power value measured by the electrical-power measuring unit 5 and is supplied to the gain adjusting unit 43.

In the first example configuration, the electrical-power measuring unit 5 includes a FW-power (forward (FW) signal) measuring unit 51, a delay adjustment memory 52, and a FB-power (feedback (FB) signal) measuring unit 53.

FIG. 3 illustrates a flow chart of gain adjustment of the first example configuration. The transmission-signal generating unit 1 assigns a unit time (carrier unit, symbol unit, or frame unit) for measuring electrical power to the electrical-power measuring unit 5 (S100). The FW-power measuring unit 51 and the FB-power measuring unit 53 measure power values of transmission signals (forward (FW) signal) and feedback (FB) signals in each assigned unit time (carrier unit, symbol unit, or frame unit) (S102 and S104). Each of the measured power values is an integral value of electrical power in one carrier unit in the unit time. When the assigned unit time is a carrier unit, the power value for one carrier is the measured power value. When the assigned unit time is a symbol unit or a frame unit, integral values of power values of carriers in one symbol or one frame are the measured power values.

The delay adjustment memory 52 adjusts the time difference between the power measuring timing of a transmission signal (FW signal) and the measuring timing of a feedback signal (FB signal) corresponding to the transmission signal. The delay adjustment memory 52 delays the output timing of the measured power value of the measured transmission signal to the gain control unit 44. The delay adjustment memory 52 supplies the measured power value of the transmission signal to the gain control unit 44 at the same timing as the output timing of the measured power value of the feedback signal.

The gain control unit 44 receives the measured power values of the two signals (FW signal and FB signal) from the electrical-power measuring unit 5 (S106) and calculates a gain adjustment value based on a ratio of the two acquired measured power values (S108). When the electrical power of the transmission signal (FW signal) from the transmission-signal generating unit 1 fluctuates, the distortion compensation coefficient deviates from the optimal value since the distortion compensation coefficient at the moment of fluctuation is not updated by following the power fluctuation (i.e., not in a converged state). Therefore, the transmission signal is distorted due to the amplification by the power amplifier 9, and the difference between the electrical power of the feedback signal (FB signal) and the electrical power of the transmission signal (FW signal) increases. The gain control unit 44 determines the electrical power ratio (FW/FB) of the FW signal to the FB signal as a gain adjustment value and outputs the gain adjustment value to the gain adjusting unit 43. The gain adjusting unit 43 multiplies the transmission signal (I data) output from the distortion-compensation-coefficient multiplying unit 42 with the gain adjustment value (S110).

A distortion-compensation-coefficient calculating unit 45 starts update of the distortion compensation coefficient upon reception of an update-start timing signal and stops the update of the distortion compensation coefficient upon reception of an update-stop timing signal. The distortion-compensation-coefficient calculating unit 45 calculates a distortion compensation coefficient corresponding to the electrical power of the input transmission signal based on the power difference between the transmission signal multiplied by the distortion compensation coefficient (signal in which the I data is gain-adjusted) and the feedback signal and updates the distortion compensation coefficient stored in the LUT 41.

The distortion-compensation-coefficient calculating unit 45 outputs the transmission signal multiplied by the distortion compensation coefficient (signal in which the I data is gain-adjusted) to the D/A converter 6. The distortion-compensated transmission signal output from the distortion-compensation-coefficient calculating unit 45 is input to the quadrature modulator 7 via the D/A converter 6. The quadrature modulator 7 performs quadrature modulation by multiplying and adding a transmission signal having a phase 90° different from the reference carrier from the quadrature modulator 7 to each of the input transmission signal. The quadrature modulator 7 mixes the quadrature-modulated signal and the reference carrier to convert the transmission signal to a radio frequency signal and outputs this to the power amplifier 9. The power amplifier 9 power-amplifies the radio frequency signal. The amplified radio frequency signal is output from the antenna 11. Part of the radio frequency signal from the power amplifier 9 is looped back inside the wireless communication apparatus via the directional coupler 10 and is converted to an IF (intermediate frequency) signal at the frequency converter 12. The IF signal is converted to digital IF data by the A/D converter 13, separated into I-signal and Q-signal parallel data strings by the frequency converter 12, and, then, is returned to the distortion compensating unit 4 as a feedback signal. The power value of the feedback signal is measured by the FB-power measuring unit 53 of the electrical-power measuring unit 5.

Figure 4A:
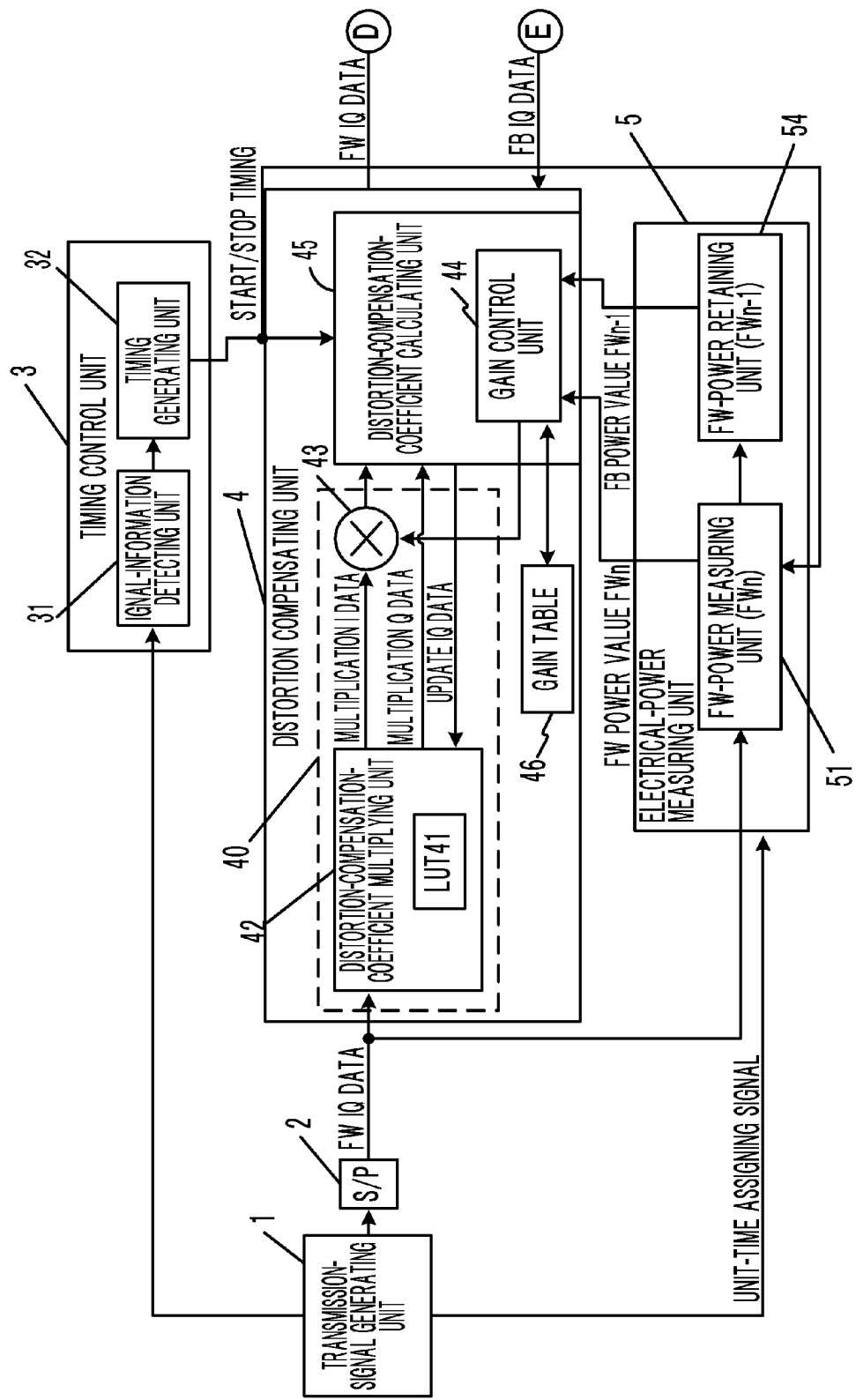
FIGS. 4A and 4B illustrate a second example configuration of a wireless communication apparatus according to an embodiment.
Figure 4B:
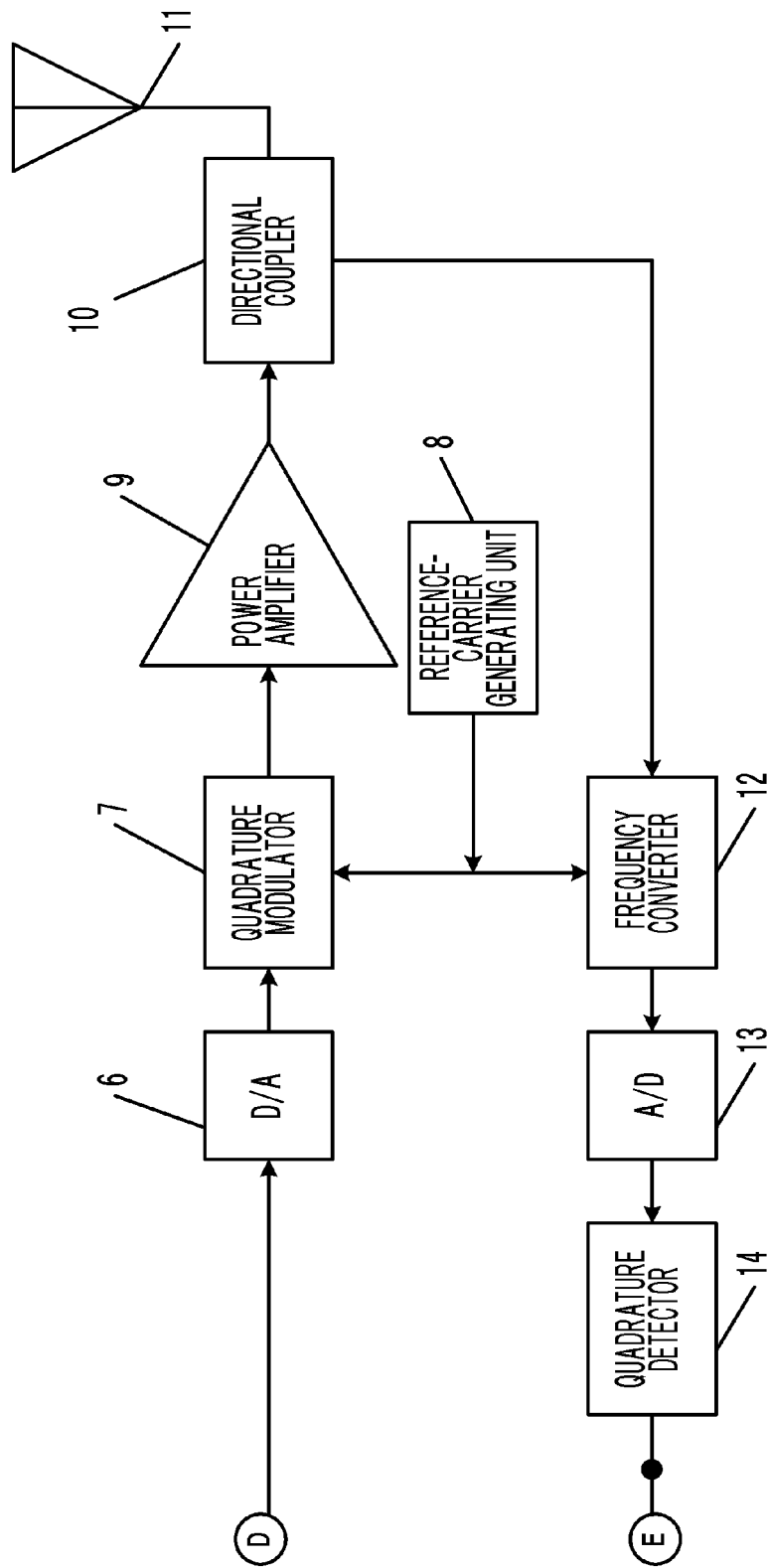

FIGS. 4A and 4B illustrates a second example configuration of a wireless communication apparatus according to the embodiment. In the second example configuration, the electrical-power measuring unit 5 includes the FW-power measuring unit 51 and a FW-power retaining unit 54. The gain control unit 44 refers to a gain table 46 to determine the gain adjustment value.

FIG. 5 illustrates a flow chart of gain adjustment of the second example configuration. Similar to the gain adjustment of the first example configuration (FIGS. 2A and 2B), the transmission-signal generating unit 1 assigns a predetermined unit time (carrier unit, symbol unit, or frame unit) for measuring electrical power to the electrical-power measuring unit 5 (S100). The FW-power measuring unit 51 measures the power value of a transmission signal (forward (FW) signal) in an assigned unit time (carrier unit, symbol unit, or frame unit) (S102 and S104). Similar to the first example configuration, the measured power value is an integral value of electrical power per carrier unit in a unit time. When the assigned unit time is a carrier unit, the power value per carrier is a measured power value. When the assigned unit time is a symbol unit or a frame unit, integral values of power values of carriers in each symbol or frame are measured power values.

The FW-power measuring unit 51 outputs a measured power value of the transmission signal for each unit time to the gain control unit 44 and the FW-power retaining unit 54. The FW-power retaining unit 54 delays the measured power value of an (n−1)th transmission signal (FWn−1) by one unit time, and outputs to the gain control unit 44 the measured power value of the (n−1)th transmission signal (FWn−1) at an output timing of a measured power value of an nth transmission signal (FWn) at the FW-power measuring unit 51. The gain control unit 44 receives the measured power value of the nth transmission signal (FWn) and the measured power value of the (n−1)th transmission signal (FWn−1) in each unit time (S206). The gain control unit 44 refers to the gain table 46 and determines a gain ratio from the gain values corresponding to the measured power values. The gain control unit 44 sets the determined value as a gain adjustment value and output this to the gain adjusting unit 43.

FIG. 6 illustrates the gain table 46. The gain table 46 is a table in which distortion compensation coefficients (gain values) corresponding to transmission powers determined in advance before shipment of the wireless communication apparatus are stored. The gain control unit 44 receives from the gain table 46 gain values corresponding to the measured power value FWn of the nth transmission signal and the measured power value FWn−1 of the n−1th transmission signal, set the ratio of the gain values as a gain adjustment value, and outputs the gain adjustment value to the gain adjusting unit 43. The gain adjusting unit 43 multiplies the transmission signal (I data) output from the distortion-compensation-coefficient multiplying unit 42 with the gain adjustment value (S210).

Since the gain adjusting unit 43 multiplies the gain adjustment value that corresponds to the nth transmission signal FWn with the (n+1)th transmission signal, the power fluctuation may be followed by a delay of one unit time. In the first example configuration, the determined power ratio is multiplied with the transmission signal of the next unit time, and the power fluctuation is followed by a delay of one unit time.

The second example configuration, unlike the first example configuration, uses only measured power values of transmission signals (only FW signals) to calculate gain adjustment values. In the second example configuration, since the power measurement of an FB signal is not desired, the gain adjustment value may be calculated without waiting for the reception of an FB signal. Thus, frequent fluctuations in the transmission power may be followed at high speed. For example, for a WiMAX system in which transmission power fluctuates frequently, it is desirable to carry out gain adjustment according to the second example configuration since the power fluctuation is followed at high speed. For an LTE system in which transmission power is relatively stable, gain adjustment according to the first example configuration may be used to provide highly precise distortion compensation. By employing the first example configuration in the WiMAX system, highly precise distortion compensation is provided.

Figure 7A:
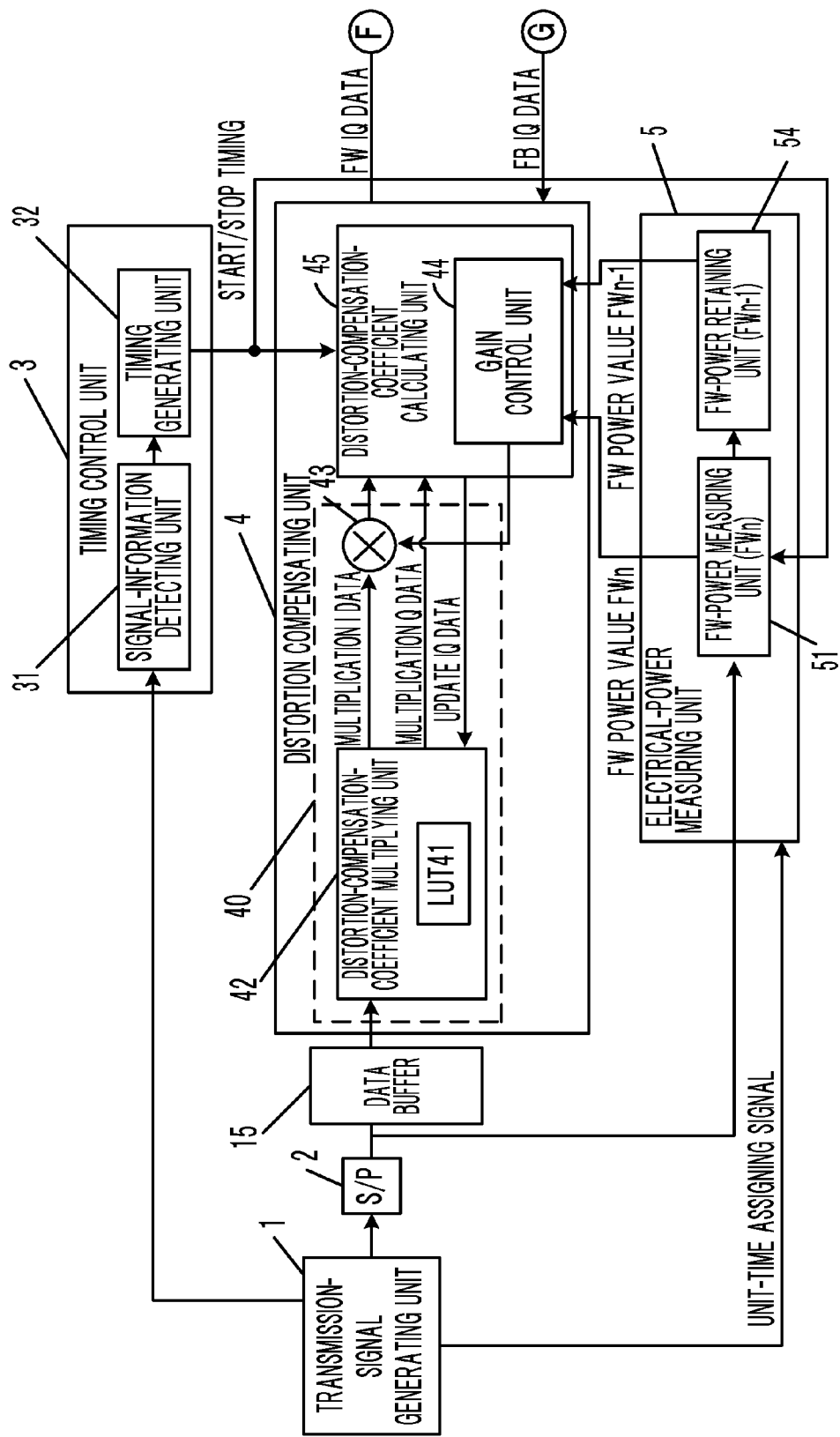
FIGS. 7A and 7B illustrate a third example configuration of a wireless communication apparatus according to an embodiment.
Figure 7B:
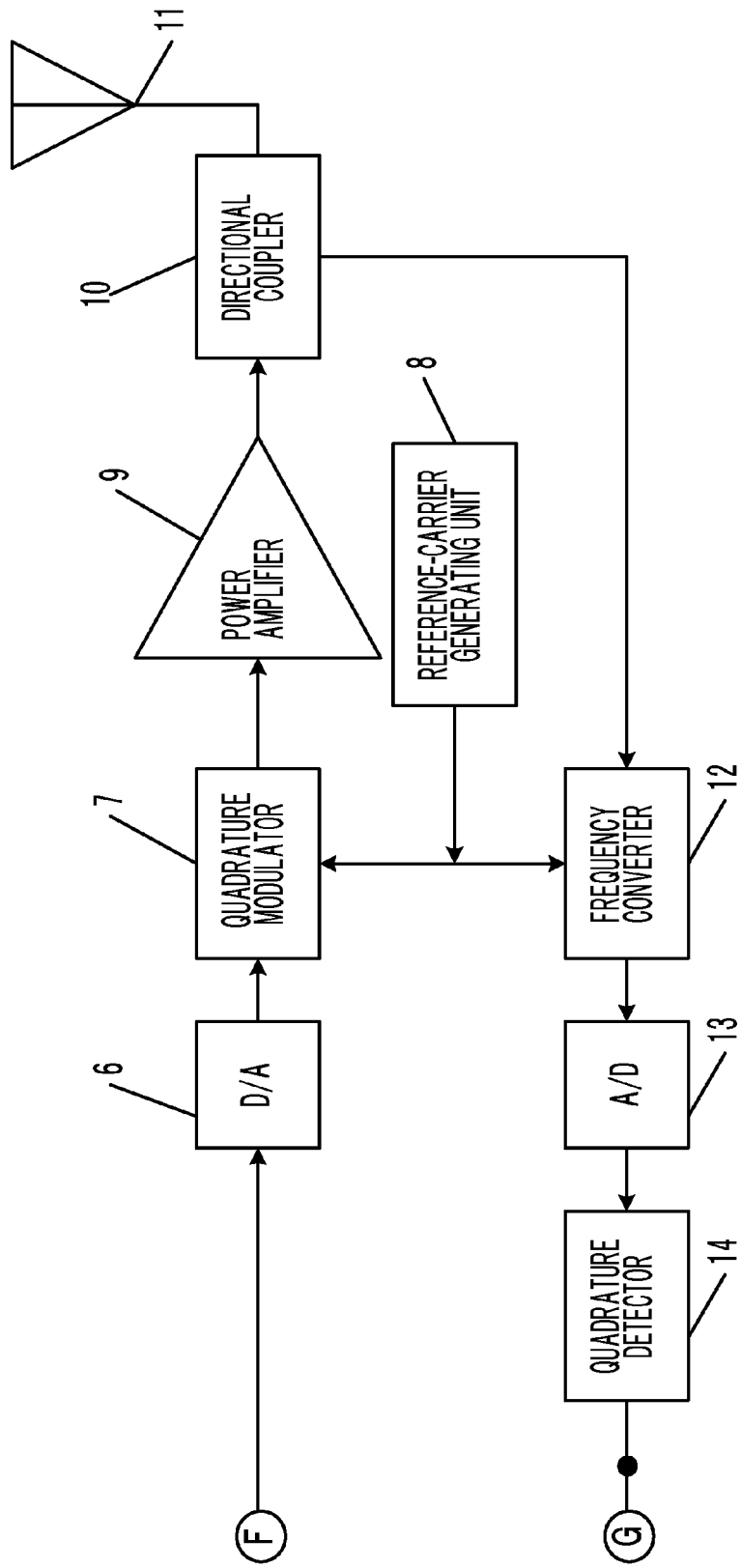

FIGS. 7A and 7B illustrate a third example configuration of the wireless communication apparatus according to the embodiment. The third example configuration, unlike the second example configuration, includes a data buffer 15 disposed upstream of the distortion compensating unit 4. The data buffer 15 delays a transmission signal by one unit time and outputs the delayed transmission signal to the distortion compensating unit 4. In this way, gain adjustment may be performed on the transmission signal itself in which power fluctuation occurred. Although the transmission timing of the wireless communication apparatus is delayed by one unit time, the power ratio determined from power fluctuation in the nth transmission signal may be multiplied with the nth transmission signal. In this way, gain adjustment may be performed with more precision, and gain adjustment may follow the power fluctuation without any delay.

FIGS. 8A to 8G illustrate correction of a distortion compensation coefficient in response to a fluctuation in transmission power. FIGS. 8A and 8B illustrate optimal distortion compensation coefficients when the levels of transmission power differ. FIG. 8A illustrates an optimal distortion compensation coefficient corresponding to a case in which the transmission power is larger than that in FIG. 8B. The vertical axis represents distortion compensation coefficient (gain), and the horizontal axis represents instantaneous power value. An instantaneous power value is a power value for a timing at which distortion compensation and distortion-compensation-coefficient updating are carried out, i.e., a power value of each carrier unit. By integrating the instantaneous power value by one symbol interval or one frame interval, the power integral value of the symbol unit or the frame unit is determined. The power integral value represents the average electrical power per unit time. The power fluctuation in the transmission signal represents a fluctuation in the measured power value per carrier unit or a fluctuation in the power integral value per symbol unit or frame unit. The electrical power of the transmission signal constantly fluctuates in carrier units. The distribution of the distortion compensation coefficients corresponding to the transmission power changes due to a change in the maximum transmission power caused by, for example, a fluctuation in the number of users. FIG. 8B illustrates, in comparison with FIG. 8A, a change in the distortion compensation coefficients corresponding to a transmission power fluctuation in which the maximum transmission power decreases. The distribution of the distortion compensation coefficients is updated such that the distortion compensation coefficient corresponding to the maximum transmission power is close or equal to the reference gain, which is an initial setting value. In this way, in the distribution, the reference gain increases as the transmission power decreases.

For example, when the average power fluctuates as the maximum transmission power fluctuates, as apparent from FIGS. 8A and 8B, the distribution of the optimal distortion compensation coefficients changes. Through updating by the distortion-compensation-coefficient calculating unit 45, as illustrated in FIG. 8C, updating of the distortion compensation coefficients from FIG. 8A to FIG. 8B is performed. However, this updating of the distortion compensation coefficients from FIG. 8A to FIG. 8B takes a certain amount of time. In distortion compensation coefficient updating, the value gradually converges to an optimal value by repeating the updating process. Therefore, immediately after the maximum transmission power fluctuates, there is a difference between the distortion compensation coefficient stored in the LUT 41 and the optimal distortion compensation coefficient, and thus, distortion of the transmission signal generated at the power amplifier may not be sufficiently compensated.

FIG. 8D illustrates a distribution of distortion compensation coefficients from FIG. 8A to FIG. 8B when only distortion compensation updating according to the related art is performed. Only distortion compensation coefficients in the range of the decreased maximum transmission signal are updated.

FIG. 8E illustrates a change in the distortion compensation coefficients when gain adjustment according to the embodiment is performed. FIG. 8F illustrates distortion compensation coefficients after gain adjustment. By reducing the gain in accordance with the fluctuation rate of the transmission power, a distortion compensation coefficient close to the optimal distortion compensation coefficient after fluctuation in the maximum transmission power may be obtained without waiting for the convergence of the distortion compensation coefficient. When the maximum transmission power returns to the power corresponding to FIG. 8A, the power may be quickly returned to a state close to that illustrated in FIG. 8A by increasing gain through gain adjustment.

Therefore, distortion of the transmission signal occurring in the period up to convergence of the distortion compensation coefficient may be suppressed, and distortion compensation that closely follows the power fluctuation of the transmission signal may be performed. Since the generation of distortion is suppressed and the level of distortion is reduced by gain adjustment, the amount of time needed for convergence of the distortion compensation coefficient may be shortened. The distortion compensation coefficient stored in the LUT 41 is not actually rewritten by gain adjustment but is virtually corrected by multiplying the transmission signal with not only the distortion compensation coefficient before convergence but also with the gain adjustment value. FIGS. 8E, 8F, and 8G illustrate the correction effect on a distortion compensation coefficient by gain adjustment. A gain-adjusted transmission signal approaches a transmission signal before transmission power fluctuation. Therefore, by applying the distortion compensation coefficient converged with respect to the transmission signal before transmission power fluctuation to a gain-adjusted transmission signal, distortion compensation by a nearly optimal distortion compensation coefficient is performed. Accordingly, the level of distortion in a transmission signal may be suppressed, and the convergence time of a distortion compensation coefficient may be shortened.

Figure 9B:
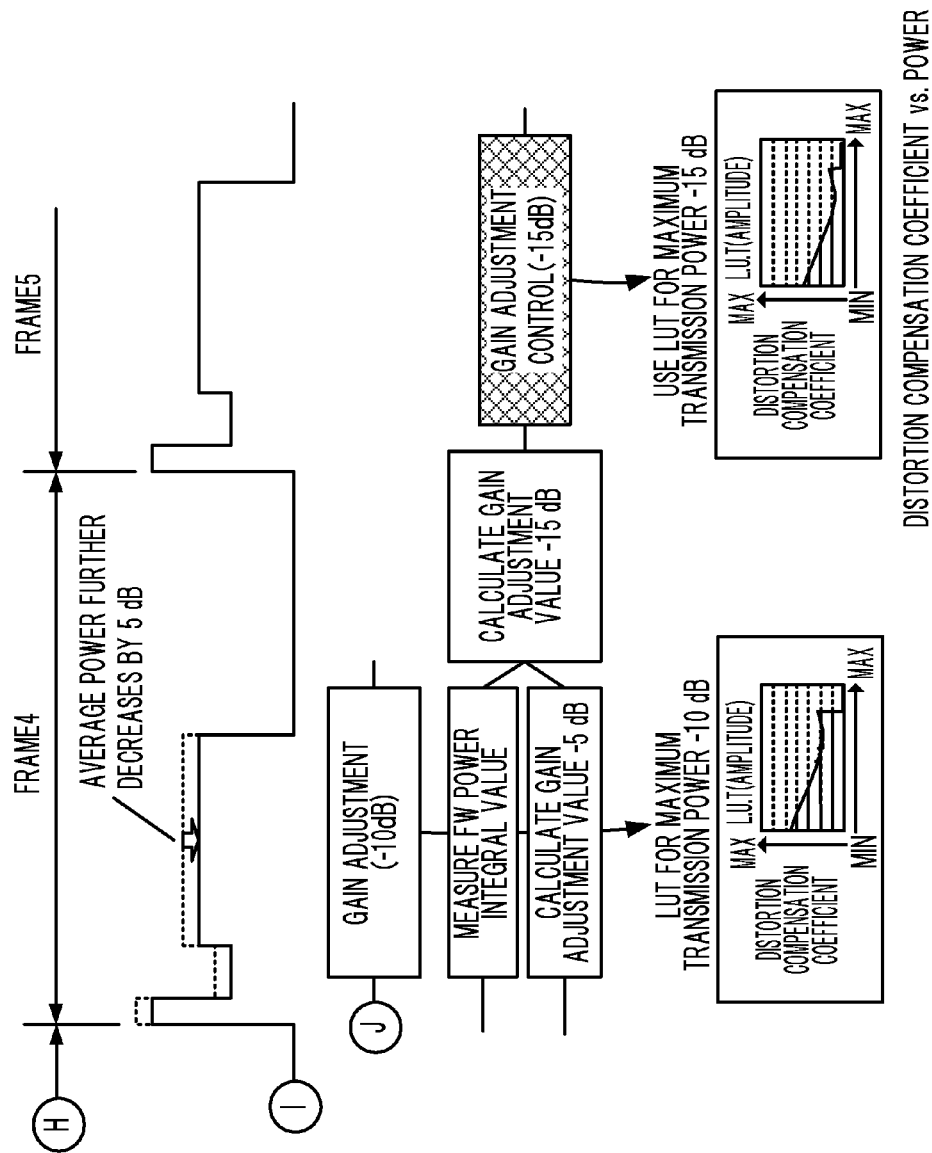

FIGS. 9A and 9B illustrate an example of gain adjustment in frame units. In the example in FIGS. 9A and 9B, a gain adjustment value is calculated using the ratio of the power integral value of an FW signal, which is described in the first example configuration illustrated in FIGS. 2A and 2B, to the power integral value of an FB signal. The power integral value of a transmission signal (FW signal) in a transmission interval of Frame 1, which is in an initial state, and a power integral value of an FB signal are determined. In the example in FIGS. 9A and 9B, an optimal distortion compensation coefficient is set in Frame 1; the power integral value of the FW signal and the power integral value of the FB value substantially match; and a gain adjustment value 0 dB is calculated. The gain adjustment value is calculated in a reception interval in which transmission is not carried out. The gain adjustment value calculated in Frame 1 is applied to the next Frame 2. Since the gain adjustment value determined in Frame 1 is 0 dB, gain adjustment is not performed in Frame 2. Each distortion compensation coefficient table (LUT) below each frame schematically illustrates distortion compensation coefficients corrected by the calculated gain adjustment values. The distortion compensation coefficient table is continuously updated by power fluctuation in the transmission signal. The example in FIGS. 9A and 9B illustrates the gain adjustment according to the embodiment with the distortion compensation coefficient table applied to Frame 1 being fixed, where distortion compensation coefficients are corrected in accordance with the gain adjustment according to the embodiment in response to power fluctuation in a transmission signal.

Therefore, the gain adjustment value applied to Frame 2, which is 0 dB, is equal to the distortion compensation coefficient applied to Frame 1, which is in an initial state.

In Frame 2, the power integral value of the FW signal and the power integral value of the FB signal in the transmission interval are determined. If the average power of Frame 2 is, for example, 5 dB lower than the average power of Frame 1, the change −5 dB in the gain adjustment value is calculated from the ratio of the power integral value of the FW signal and the power integral value of the FB signal. The gain adjustment value calculated in each frame is the sum of the gain adjustment value calculated in the previous frame and the change in the gain adjustment value in the current frame. Consequently, the gain adjustment value in Frame 2 is −5 dB (0 dB+(−5 dB)). In Frame 3, gain adjustment of −5 dB is performed on the transmission signal. This is virtually the same effect as lowering the distortion compensation coefficient table by −5 dB.

In Frame 3, the average power of the transmission interval is further lowered by −5 dB with respect to Frame 2. The gain adjustment value in Frame 3 is −10 dB (−5 dB+(−5 dB)), which is the sum of the gain adjustment value −5 dB calculated in Frame 2 and the change −5 dB of the gain adjustment value determined in frame 3 from the ratio of the power integral value of the FW signal to the power integral value of the FB signal. Consequently, in Frame 4, gain adjustment of −10 dB is performed on the transmission signal. Similarly, in Frame 4, the average power of the transmission interval is further lowered by −5 dB with respect to Frame 3, and the gain adjustment value −15 dB (−10 dB+(−5 dB)) is calculated. Consequently, in Frame 5, gain adjustment of −15 dB is performed on the transmission signal.

In this way, by performing gain adjustment in frame units, generation of distortion by fluctuation in the transmission power may be suppressed without waiting for updating and convergence of the distortion compensation coefficient, and the speed of convergence of the distortion compensation coefficient may be increased.

Figure 10A:
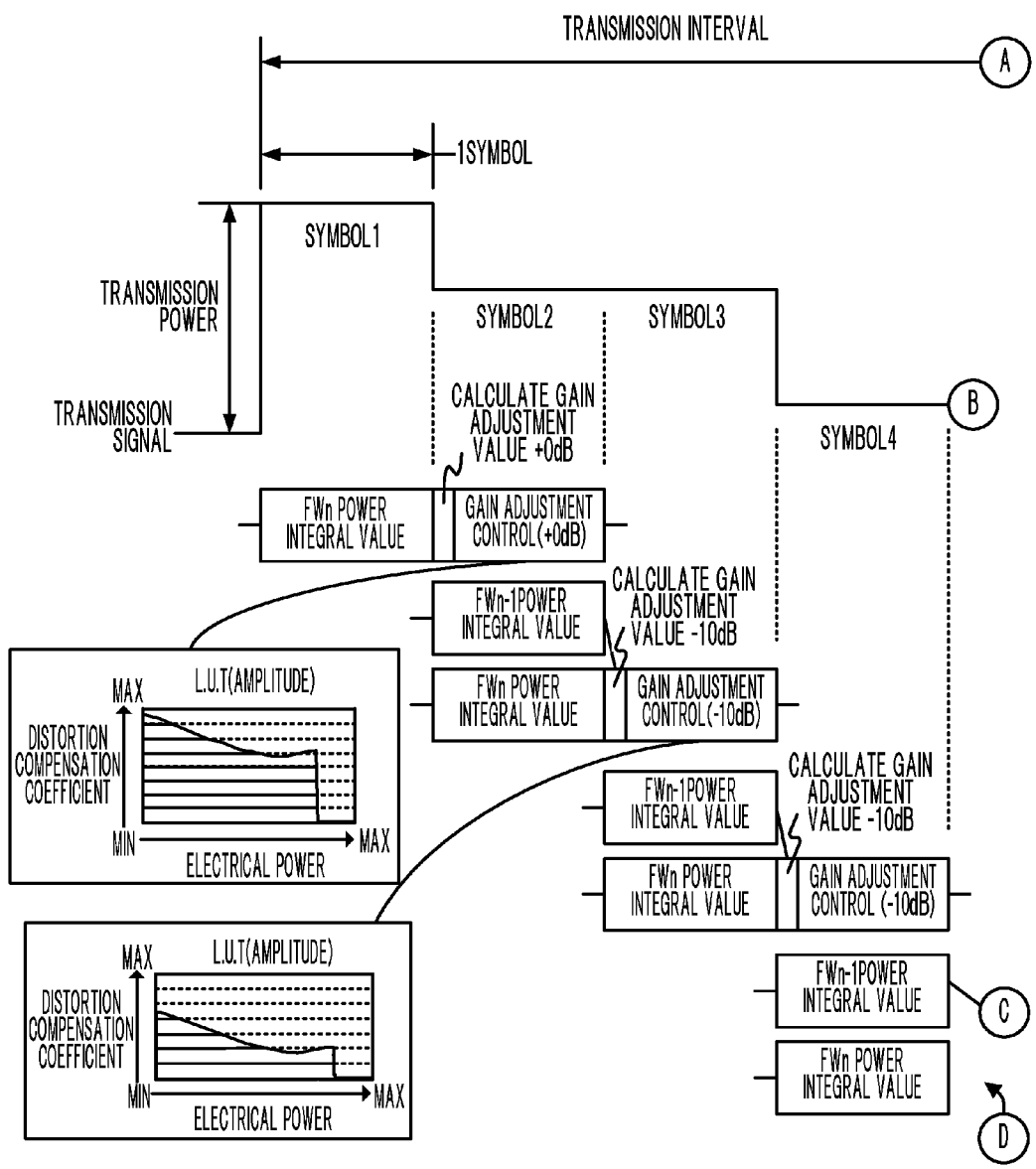
FIGS. 10A and 10B illustrate an example of gain adjustment in symbol units.
Figure 10B:
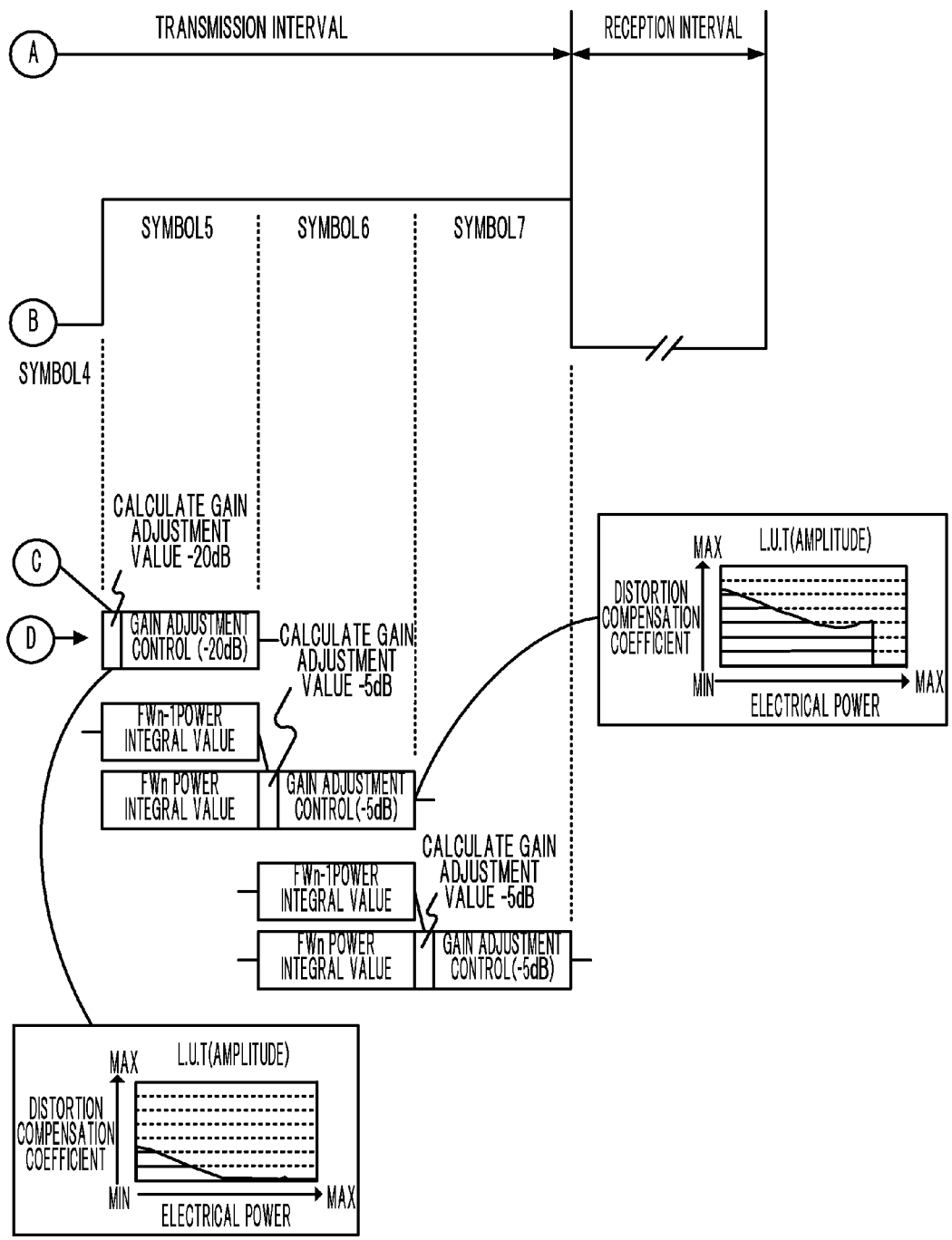

FIGS. 10A and 10B illustrate an example of gain adjustment in symbol units. In the example in FIGS. 10A and 10 B, a gain adjustment value is calculated using the ratio of the power integral value of the nth transmission signal FWn, which is described in the second example configuration illustrated in FIGS. 4A and 4B, to the power integral value of the (n−1)th transmission signal FWn−1. Similar to the example in FIGS. 9A and 9B, the example in FIGS. 10A and 10B illustrates the gain adjustment according to the embodiment with the distortion compensation coefficient table applied to Symbol 1 being fixed, where distortion compensation coefficients are corrected in accordance with the gain adjustment according to the embodiment in response to power fluctuation in a transmission signal.

The power integral value of a transmission signal (FW signal) in Symbol 1, which is in an initial state, is determined. In Symbol 1, since the (n−1)th power integral value is not determined, the gain adjustment value is set to 0 dB. The gain adjustment value 0 dB is applied to the next Symbol 2. In other words, the distortion compensation coefficient is the same as that applied to Symbol 1, which is in an initial state.

In Symbol 2, the transmission power is lowered with respect to Symbol 1. The change −10 dB of the gain adjustment value is calculated from the ratio of the power value measured in Symbol 2 (nth power integral value) to the power value measured in Symbol 1 ((n−1)th power integral value). The gain adjustment value in Symbol 2 is −10 dB, which is the sum of the gain adjustment value (0 dB) in Symbol 1 and the change −10 dB of the current gain adjustment value, and is applied to the next Symbol 3.

In Symbol 3, since the transmission power does not fluctuate with respect to Symbol 2, the change in the gain adjustment value determined from the ratio of the power value measured in Symbol 3 (nth power integral value) to the power value measured in Symbol 2 ((n−1)th power integral value) is 0 dB. Consequently, the gain adjustment value in Symbol 3 is −10 dB, which is the sum of the gain adjustment value in Symbol 2 (−10 dB) and the change 0 dB in the current gain adjustment value, and is applied to the next Symbol 4.

In Symbol 4, the transmission power is lowered with respect to Symbol 3. For example, the change of the gain adjustment value determined from the ratio of the power value measured in Symbol 4 (nth power integral value) to the power value measured in Symbol 3 ((n−1)th power integral value) is set to −10 dB. In this case, the gain adjustment value in Symbol 4 is −20 dB, which is the sum of the gain adjustment value in Symbol 3 (−10 dB) and the change −10 dB in the current gain adjustment value, and is applied to the next Symbol 5.

In Symbol 5, the transmission power is increased with respect to Symbol 4. For example, the change of the gain adjustment value determined from the ratio of the power value measured in Symbol 5 (nth power integral value) to the power value measured in Symbol 4 ((n−1)th power integral value) is set to +15 dB. In this case, the gain adjustment value in Symbol 5 is −5 dB, which is the sum of the gain adjustment value in Symbol 4 (−20 dB) and the change +15 dB in the current gain adjustment value, and is applied to the next Symbol 6.

In Symbol 6, since the transmission power does not fluctuate with respect to Symbol 5, the change in the gain adjustment value determined from the ratio of the power value measured in Symbol 6 (nth power integral value) to the power value measured in Symbol 5 ((n−1)th power integral value) is 0 dB. Consequently, the gain adjustment value in Symbol 6 is −5 dB, which is the sum of the gain adjustment value in Symbol 5 (−5 dB) and the change 0 dB in the current gain adjustment value. Symbol 7 is the same as Symbol 6.

When gain adjustment is performed in symbol units, the fluctuation of the transmission power in one frame may be followed in symbol units. Thus, generation of distortion by fluctuation in the transmission power may be suppressed, and the speed of convergence of the distortion compensation coefficient may be increased.

FIG. 11 illustrates an example of gain adjustment in carrier units. FIG. 11 illustrates the power fluctuation in one symbol. Similar to the case in FIGS. 10A and 10B, calculation of a gain adjustment value using the ratio of the power integral value of the nth transmission signal (FWn), which described in the second example configuration illustrated in FIGS. 4A and 4B, to the power integral value of the (n−1)th transmission signal (FWn−1) is illustrated. In the example illustrated in FIG. 11, the gain adjustment value for the first Carrier 1, which is in an initial state, is 0 dB. In the next Carrier 2, the transmission power is lowered with respect to Carrier 1, and a gain adjustment value −1 dB is calculated. In the next Carrier 3, the transmission power does not change with respect to Carrier 2, and a gain adjustment value −1 dB, which is the same as that in Carrier 2, is determined. Also for the example in FIG. 11, the gain adjustment value calculated for a certain carrier is applied to gain adjustment for the next carrier.

Gain adjustment in frame units, symbol units, and carrier units, which are illustrated in FIGS. 9A-9B, 10A-10B, and 11, respectively, can be switched appropriately to correspond to the communication environment. Gain adjustment in carrier units is capable of following the fluctuation of the transmission power in the shortest amount of time. The unit time for gain adjustment is selected based on actors such as the frequency of the power fluctuation and the load of the calculating. For example, the selection condition for the unit time is as follows.

Carrier unit: an increase and/or a decrease in the number of users occur frequently, and the level of power fluctuation in the carrier data in a symbol is extremely large.

Symbol unit: during low throughput transmission or when the increase and/or the decrease in the number of users is relatively stable and the level of fluctuation of the transmission power in a frame is approximately 3 to 5 dB.

Frame unit: the increase and/or the decrease in the number of users is more stable than that of the condition for symbol units when the transmission power is close to the maximum transmission power and the level of fluctuation of the transmission power in a frame is approximately 1 to 2 dB.

FIGS. 12A-12F illustrate changes in distortion in a transmission signal due to gain adjustment according to the embodiment. The horizontal axis represents frequency, and the vertical axis represents electrical power. Only the power spectrum of one channel is illustrated. FIGS. 12A, 12B, and 12C illustrate changes in distortion when the gain adjustment according to the embodiment is not employed. FIGS. 12D, 12E, and 12F illustrate changes in distortion when the gain adjustment according to the embodiment is employed.

FIG. 12A illustrates a power spectrum when the distortion compensation coefficient is converged and set to an optimal value. The side lobes are low, and adjacent channel power leakage is suppressed. In this state, for example, when a transmission power fluctuation of approximately −5 dB occurs, the distortion compensation coefficient is not updated unless the gain adjustment according to the embodiment is performed. Until the distortion compensation coefficient converges, as illustrated in FIG. 12B, the side lobes increase, and distortion occurs (for example, this is a deterioration of approximately 5 to 10 dB with respect to a power fluctuation of −5 dB). For the distortion compensation coefficient to be updated and to converge to the state illustrated in FIG. 12C, a relatively large amount of time is needed.

When the gain adjustment according to the embodiment is employed, gain adjustment is carried out by power fluctuation when the transmission power fluctuates by approximately −5 dB from the condition in FIG. 12D, which illustrates a power spectrum in which the distortion compensation coefficient is set to an optimal value. Therefore, as illustrated in FIG. 12E, the generation of distortion may be suppressed to a low level (for example, a deterioration of approximately 2 to 4 dB with respect to a power fluctuation of −5 dB). In other words, an increase in the side lobes and adjacent channel power leakage is minimized. Since the level of distortion is small, compared to when gain adjustment is not performed, the distortion compensation coefficient converges to the stable state illustrated in FIG. 12F in a small amount of time.

The gain adjustment according to the embodiment is capable of instantaneous gain adjustment compared to known LUT updating. On the other hand, when the fluctuation in the transmission power is small, i.e., less than 2 to 3 dB, the distortion due to the effect of gain adjustment may become large. Therefore, it is desirable that gain adjustment be performed only when the power difference between the power value of a transmission signal and the power value of a feedback signal exceeds a threshold (distortion compensation by both a gain adjustment value and a distortion compensation coefficient). When the threshold is not exceeded, it is desirable that only known LUT updating be carried out (distortion compensation without multiplying the gain adjustment value and only multiplying a distortion compensation coefficient). In this way, the generation of unexpected distortion may be prevented.

When the level of fluctuation of the transmission power exceeds the threshold, it is desirable that first, coarse distortion convergence corresponding to the sudden power fluctuation be carried out by gain adjustment, and then, known LUT updating be carried out with high distortion compensation precision. The known LUT updating has high distortion compensation precision but takes a large amount of time and does not support distortion convergence due to a sudden power fluctuation. By combining gain adjustment with the known LUT updating, the total amount of time needed to converge a distortion compensation coefficient may be reduced.

The wireless communication apparatus according to the embodiment may be applied to either base stations or mobile stations of a mobile communication system, such as a WiMAX system or a long term evolution (LTE) system.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication apparatus configured to amplify a transmission signal with an amplifier and transmit the amplified transmission signal, the wireless communication apparatus comprising:
    a memory configured to store a distortion compensation coefficient for compensating a distortion characteristic of the amplifier;
    an electrical-power measuring unit configured to measure electrical power of the transmission signal;
    a gain control unit configured to calculate a gain adjustment value for correcting the distortion compensation coefficient stored in the memory based on a power value measured by the electrical-power measuring unit;
    a distortion-compensation processing unit configured to perform distortion compensation on the transmission signal based on the distortion compensation coefficient stored in the memory and the gain adjustment value; and
    a distortion-compensation-coefficient updating unit configured to calculate the distortion compensation coefficient based on the distortion-compensated transmission signal input to the amplifier and a feedback signal of the amplified transmission signal output from the amplifier and updates the distortion compensation coefficient stored in the memory with the calculated distortion compensation coefficient, wherein the electrical-power measuring unit measures a power value for each unit time for each of the transmission signal and the feedback signal, and wherein the gain control unit calculates the gain adjustment value based on a ratio of a power value of the transmission signal in a predetermined unit time to a power value of the feedback signal corresponding to the transmission signal in the predetermined unit time.

2. The wireless communication apparatus according to claim 1, wherein the gain control unit calculates the gain adjustment value based on a ratio of a power value of the transmission signal in a predetermined unit time to a power value of the transmission signal one unit time before the predetermined unit time.

3. The wireless communication apparatus according to claim 2, further comprising:

a buffer configured to accumulate transmission signals for a unit time, wherein the distortion-compensation processing unit adjusts a gain of the transmission signal output from the buffer with a delay of one unit time.

4. The wireless communication apparatus according to claim 1, wherein the unit time is a frame unit time, a symbol unit time, or a carrier unit time.

5. A wireless communication apparatus configured to amplify a transmission signal with an amplifier and transmit the amplified transmission signal, the wireless communication apparatus comprising:

a memory configured to store a distortion compensation coefficient for compensating a distortion characteristic of the amplifier;

an electrical-power measuring unit configured to measure electrical power of the transmission signal;

a gain control unit configured to calculate a gain adjustment value for correcting the distortion compensation coefficient stored in the memory based on a power value measured by the electrical-power measuring unit;

a distortion-compensation processing unit configured to perform distortion compensation on the transmission signal based on the distortion compensation coefficient stored in the memory and the gain adjustment value; and a distortion-compensation-coefficient updating unit configured to calculate the distortion compensation coefficient based on the distortion-compensated transmission signal input to the amplifier and a feedback signal of the amplified transmission signal output from the amplifier and updates the distortion compensation coefficient stored in the memory with the calculated distortion compensation coefficient, wherein the distortion-compensation processing unit performs distortion compensation on the transmission signal based on the distortion compensation coefficient stored in the memory and the gain adjustment value when a power difference between a power value of the transmission signal and a power value of the feedback signal exceeds a threshold, and performs distortion compensation on the transmission signal based on the distortion compensation coefficient stored in the memory when the power difference between the power value of the transmission signal and the power value of the feedback signal is less than or equal to the threshold.

\* \* \* \* \*